United States Patent
Hsin

(10) Patent No.: US 7,402,839 B2
(45) Date of Patent: Jul. 22, 2008

(54) IMAGE SENSOR PACKAGE STRUCTURE

(75) Inventor: Chung Hsien Hsin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 124 days.

(21) Appl. No.: 11/378,794

(22) Filed: Mar. 16, 2006

(65) Prior Publication Data
US 2007/0215972 A1    Sep. 20, 2007

(51) Int. Cl.
*H01L 33/00*   (2006.01)
(52) U.S. Cl. .................................................. 257/98
(58) Field of Classification Search ........... 257/98–100, 257/687, 704, E33.001–E33.077; 438/60, 438/64, 69–72
See application file for complete search history.

(56) References Cited

U.S. PATENT DOCUMENTS 6,740,967 B1 *  5/2004  Pai ............................. 257/704
2004/0113221 A1 *  6/2004  Hsieh et al. .................. 257/433
2006/0008939 A1 *  1/2006  Chen et al. ..................... 438/65
2007/0090284 A1 *  4/2007  Ho et al. ...................... 250/239
2007/0145569 A1 *  6/2007  Hsin ............................ 257/700

* cited by examiner

*Primary Examiner*—Calvin Lee
(74) *Attorney, Agent, or Firm*—Reed Smith LLP; Stanley P. Fisher, Esq.; Juan Carlos A. Marquez, Esq.

(57) ABSTRACT

An image sensor package structure includes a plastic substrate, frame layer, a chip, wires, a transparent layer, and an encapsulate layer. The plastic substrate has an upper surface, which is formed with first electrodes, and a lower surface, which is formed with second electrodes. The frame layer is arranged on the upper surface of the plastic substrate, a cavity is formed between the plastic substrate and the frame layer. The chip is mounted on the upper surface of the plastic substrate, and is located within the cavity. The plurality of wires are electrically connected the chip to the first electrodes of the plastic substrate. The transparent layer is mounted on the frame layer to cover the chip. And the encapsulate layer is encapsulated the frame layer, and is covered on the periphery the transparent layer.

3 Claims, 1 Drawing Sheet

IMAGE SENSOR PACKAGE STRUCTURE

BACKGROUND OF THE INVENTION

1. Field of the Invention

The invention relates an image sensor package, and particular to a structure for packaging image sensor, the cast of the package structure may be decreased.

2. Description of the Related Art

Referring to FIG. 1, it is an image sensor package structure includes a ceramic substrate 10, a chip 12, a plurality of wires 14, and a transparent layer 16.

The ceramic substrate 10 has an upper surface 18, on which a frame layer 21 is formed on, and a lower surface 20. The upper surface 18 of the ceramic substrate 10 is formed with first electrodes 24, the lower surface 20 of the ceramic substrate 10 is formed with second electrodes 26, which is metallic pin. The chip 12 is formed with pads 28, and is arranged on the upper surface 18 of the plastic substrate 10, and is located within the cavity 22. The wire 15 are electrically connected the first electrodes 24 of the ceramic substrate 10 to the pads 28 of the chip 12. The transparent layer 16 is adhered on the frame layer 21 of the ceramic substrate 10.

SUMMARY OF THE INVENTION

An objective of the invention is to provide an image sensor package structure, and capable of decreasing the cost of structure.

To achieve the above-mentioned object, the invention includes a plastic substrate, frame layer, a chip, wires, a transparent layer, and a encapsulate layer. The plastic substrate has an upper surface, which is formed with first electrodes, and a lower surface, which is formed with second electrodes. The frame layer is arranged on the upper surface of the plastic substrate, a cavity is formed between the plastic substrate and the frame layer. The chip is mounted on the upper surface of the plastic substrate, and is located within the cavity. The plurality of wires are electrically connected the chip to the first electrodes of the plastic substrate. The transparent layer is mounted on the frame layer to cover the chip. And the encapsulate layer is encapsulated the frame layer, and is covered on the periphery the transparent layer.

DETAILED DESCRIPTION OF THE INVENTION

Figure 1:
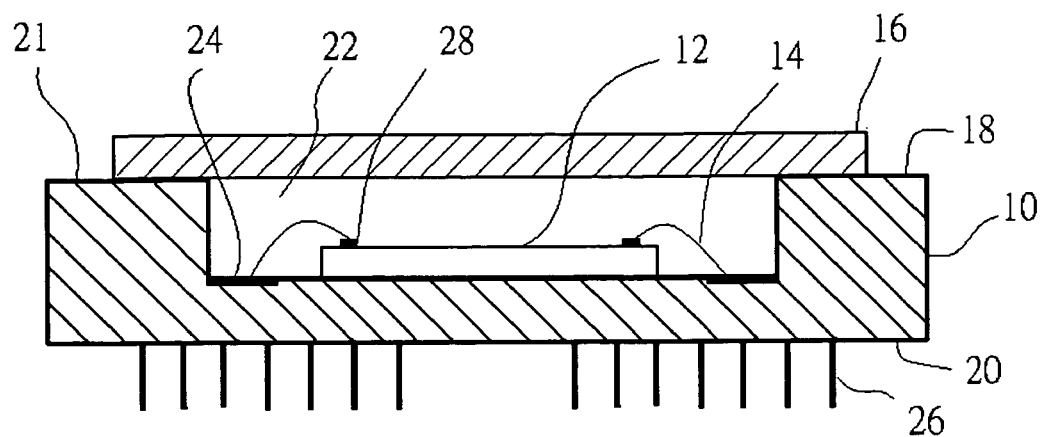
FIG. 1 is a schematic illustration showing a conventional image sensor package structure.
Figure 2:
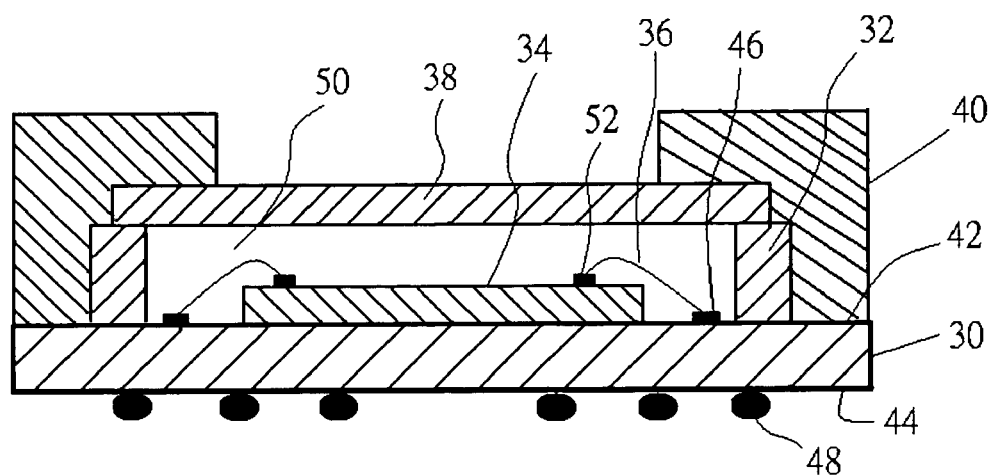
FIG. 2 is a cross-sectional schematic illustration showing an image sensor package structure of the present invention.

Please refer to FIG. 2, an image sensor package structure includes a plastic substrate 30, a frame layer 32, chip 34, wires 36, a transparent layer 38, and an encapsulate layer 40.

The plastic substrate 30 has an upper surface 42, which is formed with first electrodes 46, and a lower surface 44, which is formed with second electrodes 48 corresponding to electrically connect to the first electrodes 46, the second electrodes 48 is formed with metallic ball.

The frame layer 32 is arranged on the upper surface 42 of the plastic substrate 30, a cavity 50 is formed between the plastic substrate 30 and the frame layer 32.

The chip 34 is mounted on the upper surface 42 of the plastic substrate 30, and is located within the cavity 50.

The plurality of wires 36 are electrically connected the chip 34 to the first electrodes 46 of the plastic substrate 30.

The transparent layer 38 is mounted on the frame layer 32 to cover the chip 34. And The encapsulate layer 40 is formed of epoxy, and is encapsulated the frame layer 32, and is covered on the periphery the transparent layer 38.

The image sensor package structure in accordance with the embodiments of the invention has the advantages as follows.

1. Since the encapsulate layer 40 is encapsulated the frame layer 32 and the transparent layer 38 to prevent wet air into the structure, thus, the reliability of the image sensor may be increased.

2. Since the plastic substrate 30 has a lower cost, so that the cost of the image sensor package may be decreased.

While the invention has been described by the way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. An image sensor package structure, the package structure comprising:

a plastic substrate having an upper surface, which is formed with first electrodes, and a lower surface, which is formed with second electrodes corresponding to electrically connect to the first electrodes;

a frame layer arranged on the upper surface of the plastic substrate, and having a cavity is formed between the plastic substrate and the frame layer;

a chip mounted on the upper surface of the plastic substrate, and located within the cavity;

a plurality of wires electically connecting the chip to the first electrodes of the plastic substrate;

a transparent layer mounted on the frame layer to cover the chip; and an encapsulate layer formed to encapsulate an outer portion of the frame layer, and an outer periphery of the transparent layer.

2. The image sensor package structure according to claim 1, wherein each of the second electrodes of the plastic susbtrate is formed to have a metallic ball thereon.

3. The image sensor package structure according to claim 1, wherein the encapsulate layer is formed of epoxy.

* * * * *